United States Patent
Basol

(10) Patent No.: US 8,258,001 B2
(45) Date of Patent: Sep. 4, 2012

(54) METHOD AND APPARATUS FOR FORMING COPPER INDIUM GALLIUM CHALCOGENIDE LAYERS

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 860 days.

(21) Appl. No.: 12/259,049

(22) Filed: Oct. 27, 2008

(65) Prior Publication Data

US 2009/0117684 A1    May 7, 2009

Related U.S. Application Data

(60) Provisional application No. 60/983,045, filed on Oct. 26, 2007.

(51) Int. Cl.
*H01L 31/0272* (2006.01)
*H01L 31/18* (2006.01)

(52) U.S. Cl. ............ 438/95; 438/93; 438/102; 136/264; 257/E31.008

(58) Field of Classification Search ............ 438/93, 438/95, 102; 136/264
See application file for complete search history.

(56) References Cited

U.S. PATENT DOCUMENTS

| | | | |
|---|---|---|---|
| 4,581,108 A | 4/1986 | Kapur et al. | |
| 4,798,660 A | 1/1989 | Ermer et al. | |
| 5,356,839 A | 10/1994 | Tuttle et al. | |
| 5,436,204 A | 7/1995 | Albin et al. | |
| 5,441,897 A | 8/1995 | Noufi et al. | |
| 5,728,231 A | 3/1998 | Negami et al. | |
| 6,048,442 A | 4/2000 | Kushiya et al. | |
| 6,092,669 A | 7/2000 | Kushiya et al. | |
| 7,585,547 B2 * | 9/2009 | Basol et al. | 427/248.1 |
| 2005/0194036 A1 * | 9/2005 | Basol | 136/252 |
| 2007/0004078 A1 * | 1/2007 | Alberts | 438/95 |
| 2007/0243657 A1 * | 10/2007 | Basol et al. | 438/95 |
| 2007/0257255 A1 | 11/2007 | Dhere et al. | |
| 2010/0029036 A1 * | 2/2010 | Robinson et al. | 438/93 |
| 2010/0248419 A1 * | 9/2010 | Woodruff et al. | 438/95 |
| 2011/0039366 A1 * | 2/2011 | Basol et al. | 438/62 |
| 2011/0108096 A1 * | 5/2011 | Basol | 136/252 |
| 2011/0114182 A1 * | 5/2011 | Robinson et al. | 136/262 |
| 2011/0139251 A1 * | 6/2011 | Robinson et al. | 136/262 |

OTHER PUBLICATIONS

Alberts, et al., "Xray Foluorescence Investigation of the Ga Distribution of Cu(In,Ga)Se2 Thin Films", *Solar Energy Materials and Solar Cells*, vol. 64, 2000, p. 371-383.

Basol et al., "Studies on Sulfur Diffusion into Cu(In,Ga)Se2 Thin Films", *Progress in Photovoltaics*, vol. 8, 2000, pp. 227-235.

(Continued)

*Primary Examiner* — Alexander Ghyka
(74) *Attorney, Agent, or Firm* — Pillsbury Winthrop Shaw Pittman LLP

(57) ABSTRACT

A multilayer structure to form absorber layers for solar cells. The multilayer structure includes a base comprising a contact layer on a substrate layer, a first layer on the contact layer, and a metallic layer on the first layer. The first layer includes an indium-gallium-selenide film and the gallium to indium molar ratio of the indium-gallium-selenide film is in the range of 0 to 0.8. The metallic layer includes gallium and indium without selenium. Additional selenium is deposited onto the metallic layer before annealing the structure for forming an absorber.

12 Claims, 4 Drawing Sheets

OTHER PUBLICATIONS

Delsol, et al., "Experimental Study of Graded Bandgap Cu(In,Ga)(SeS)2 Thin Films Grown on Glass/Molybdenum Substrates by Selenization and Sulphidation", *Solar Energy Materials and Solar Cells*, vol. 82, 2004, pp. 587-599.

Marudachalam et al., "Phases, Morphology, and Diffusion in CuInxGa1-xSe2 Thin Films", *J. Appl. Phys.*, vol. 82, 1997, pp. 2896-2905.

Nakagawa, et al., "Development of Cu(In,Ga)Se2 Thin Film Solar Cells by Encapsulated Selenization", *14th European Photovoltaic Solar Energy Conf.*, 1997, pp. 1216-1219.

Ramanathan, et al., "Properties of 19.2% Efficiency ZnO/CdS/CuInGaSe2 Thin Film Solar Cells", *Progress in Photovoltaics*, vol. 11, 2003, pp. 225-230.

Lundberg, "Influence of the Cu(In,Ga)Se2 Thickness and Ga Grading on Solar Cell Performance", Prog. Photovol. Res. Appl, vol. 11, Issue 2, pp. 77-88, Nov. 22, 2002.

* cited by examiner

METHOD AND APPARATUS FOR FORMING COPPER INDIUM GALLIUM CHALCOGENIDE LAYERS

This application claims priority to U.S. Provisional Application Ser. No. 60/983,045, filed Oct. 26, 2007, entitled "Method and Apparatus for Forming Copper Indium Gallium Chalcogenide Layers", which application is expressly incorporated by reference herein.

The present invention relates to method and apparatus for preparing thin films of semiconductor films for radiation detector and photovoltaic applications.

FIELD OF THE INVENTION

Background

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (copper or Cu, silver or Ag, gold or Au), Group IIIA (boron or B, aluminum or Al, gallium or Ga, indium or In, thallium or Tl) and Group VIA (oxygen or 0, sulfur or S, selenium or Se, tellurium or Te, polonium or Po) materials or elements of the periodic table are excellent absorber materials for thin film solar cell structures. Especially, compounds of Cu, In, Ga, Se and S which are generally referred to as CIGS(S), or Cu(In,Ga)(S,Se)$_2$ or CuIn$_{1-x}$Ga$_x$(S$_y$Se$_{1-y}$)$_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for CIGS (S) is often written as Cu(In,Ga)(S,Se)$_2$, a more accurate formula for the compound is Cu(In,Ga)(S,Se)$_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, Cu(In, Ga)(S,Se)$_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a Cu(In,Ga,Al)(S,Se,Te)$_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of Cu(In,Ga,Al)(S,Se,Te)$_2$, is grown over a conductive layer 13 or contact layer, which is previously deposited on the substrate 11 and which acts as the electrical contact to the device. The substrate 11 and the conductive layer 13 form a base 13A on which the absorber film 12 is formed. Various conductive layers comprising Mo, Ta, W, Ti, and their nitrides etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO, CdS/ZnO or CdS/ZnO/ITO etc. stack is formed on the absorber film 12. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the Cu(In,Ga,Al)(S,Se,Te)$_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a Cu(In,Ga)(S,Se)$_2$ absorber layer, for example, the efficiency of the device is a function of the molar ratio of Cu/(In +Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In +Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. So far experimental results have shown that a Ga/(Ga+In) ratio of about 0.2-0.3 at the junction area (top 0.1 to 0.3 μm of the CIGS surface) yields the highest efficiency solar cells. When this ratio increases further, the device efficiency gets reduced. Although the reasons for this are not fully understood, it is reported that the electronic quality of CIGS material gets worse as the Ga/(Ga+In) ratio increases beyond 0.3. It is important for a thin film deposition process to have the capability of controlling both the molar ratio of IB/IIIA, and the molar ratios of the Group IIIA components in the composition.

One attractive technique for growing Cu(In,Ga)(S,Se)$_2$ type compound thin films for solar cell applications is a two-stage process where metallic components of the Cu(In, Ga)(S,Se)$_2$ material are first deposited onto a substrate during the first stage of the process, and then reacted with S and/or Se in a high temperature annealing process during the second stage. Sputtering and evaporation techniques have been used in prior art approaches to deposit the layers containing the Group IB and Group IIIA components of the precursor stacks during the first stage of such a process. In the case of CuInSe$_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. U.S. Pat. No. 6,092,669 described sputtering-based equipment for producing such absorber layers. According to a method described in U.S. Pat. No. 4,581,108, a Cu layer is first electrodeposited on a substrate; this is then followed by electrodeposition of an In layer and heating of the deposited Cu/In stack in a reactive atmosphere containing Se to form $CuInSe_2$ or CIS. Although CIS formation using two-stage processes is rather straight forward, complications arise when Ga is added to be able to form a CIGS absorber.

Curve A in FIG. 2 schematically shows a typical distribution profile for the Ga/(Ga+In) molar ratio for a $Cu(In,Ga)Se_2$ absorber layer formed by a two-stage process involving selenization of metallic precursors comprising Cu, In and Ga. As can be seen from this figure, one problem faced with the selenization type or two-stage processes is the difficulty to distribute Ga uniformly through the thickness of the absorber layer formed after reaction of Cu, In and Ga containing metallic precursor film with Se. It is believed that when a metallic precursor film comprising Cu, In and Ga is deposited first on a contact layer of a base and then reacted with Se, the Ga-rich phases segregate to the film/base interface (or the film/contact layer interface) because reactions between Ga-bearing species and Se are slower than the reactions between In-bearing species and Se. Therefore, such a process yields compound absorber layers with surfaces that are rich in In and poor in Ga. Various reports in the literature have described this phenomenon (see for example, Basol et al., Progress in Photovoltaics, vol. 8 (2000) p. 227, Alberts et al., Solar Energy Materials and Solar Cells, vol. 64 (2000) p. 371, Marudachalam et al., J. Appl. Phys., vol. 82 (1997) p. 2896, Delsol et al., Solar Energy Materials and Solar Cells, vol. 82 (2004) p. 587).

When a solar cell is fabricated on an absorber layer with Ga gradation such as the one shown in FIG. 2, the active junction of the device is formed within the surface region with a low Ga/(Ga+In) ratio, which is in fact zero for Curve A. This surface portion or region, therefore, is practically a $CuInSe_2$ layer with a small bandgap and consequently solar cells fabricated on such layers display low open circuit voltages (typically in the range of 400-500 mV) and thus lower efficiencies. In contrast, curve B in FIG. 2 schematically shows a relatively uniform Ga/(Ga+In) molar ratio distribution through the thickness of the absorber. Solar cells fabricated on such absorbers display higher voltage values of typically over 600 mV due to the presence of Ga (typically 20-30%) near the surface region. The world record holding CIGS solar cells with over 19% conversion efficiency were demonstrated on such an absorber obtained by a co-evaporation process (see, for example Ramanathan et al., Progress in Photovoltaics, vol. 11 (2003) p. 225). Obtaining Ga distribution profiles with more Ga near the surface region for absorbers fabricated using two-stage processes is important to increase the performance of such absorbers.

As described above, the co-evaporation methods where the Cu, In, Ga and Se species are co-deposited onto a surface of a heated substrate where they react and form the compound monolayer at a time have the capability to control and shape the distribution of Ga and In through the CIGS film (see for example, U.S. Pat. Nos. 5,356,839, 5,436,204, and 5,441,897). Although attractive for manufacturing, the two-stage processes have not had this capability because the film deposition step, when the Cu, In, Ga and possibly Se species are deposited in a non-reactive manner, is separated from the reaction step when the actual CIGS compound film is fully formed with properties appropriate for solar cell fabrication. Several attempts were made to investigate the possibility of controlling Ga distribution within absorbers grown by the two-stage processes. Marudachalam et al. (J. Appl. Phys., vol. 82 (1997) p. 2896), for example, annealed CIGS layers at high temperatures to diffuse Ga to the surface from the back side of the absorber after forming a CIGS layer with Ga distribution similar to curve A in FIG. 2. Nakagawa et al. ($14^{th}$ European Photovoltaic Solar Energy Conf., 1997, p. 1216) prepared CIGS layers using various types of precursor stacks including metallic and non-metallic layers with the goal of producing different Ga distribution profiles alter reacting the stacks. The stacks investigated by Nakagawa et al. were In—Se/Cu/Ga—Se, In—Se/Ga—Se/Cu, Cu/In—Se/Ga—Se, Cu/Ga—Se/In—Se, Ga—Se/Cu/In—Se, Ga—Se/In—Se/Cu, In—Se/Ga—Se/Cu/Ga—Se, Ga—Se/In—Se/Cu/Ga—Se, and Ga—Se/In—Se/Ga—Se/Cu stacks, where In—Se and Ga—Se refer to selenides of In and Ga, respectively.

As the review above demonstrates there is still need to develop two stage processing approaches that can yield desirable Ga distribution profiles in CIGS type absorber layers so that high efficiency solar cells may be fabricated using such absorber layers.

SUMMARY OF THE INVENTION

Present invention provides a method of making a multilayer structure for manufacturing solar cell absorbers. The multilayer structure may be built on a continuous flexible foil or workpiece which is suitable for roll-to-roll or reel-to-reel manufacturing processes.

In an aspect of the present invention, a multilayer structure to form absorber layers for solar cells is provided. The multilayer structure includes a base having a substrate layer; a first layer formed on the base, and a metallic layer formed on the first layer. The first layer includes an indium-gallium-selenide film, which the gallium to indium molar ratio of the indium-gallium-selenide film is in the range of 0 to 0.8. The metallic layer includes gallium and indium without a Group VIA material, and indium and gallium in the metallic layer form a stack comprising at least one indium film and at least one gallium film. A molar ratio of gallium to gallium and indium in the metal layer is in the range of 0.2-0.3.

In another aspect of the present invention, a process of forming a Group IBIIIAVIA absorber layer on a base is provided. The process includes forming a first layer comprising an indium-gallium-selenide compound film on the base, forming a metallic layer on the first layer, the metallic layer comprising a Group IB metal, a Group IIIA metal and another Group IIIA metal without a Group VIA material, and reacting the first layer, the metallic layer and a Group VIA material. The first layer further includes a first metal film of a Group IB metal, wherein the indium-gallium-selenide compound material film is deposited over the first metal film. Forming the metallic layer includes depositing a copper film onto the first layer, depositing a gallium film onto the copper film, and depositing an indium film onto the gallium film.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

Present invention provides a method of making a multilayer structure for manufacturing solar cell absorbers. The multilayer structure may be built on a continuous flexible foil or workpiece which is suitable for roll-to-roll or reel-to-reel manufacturing processes, i.e., feeding the continuous substrate from a supply roll into the process tool that manufactures the multilayer structure and taking up and wrapping the finished product around a take-up roll.

In a first embodiment the method includes forming a first layer of a precursor stack on a conductive contact layer of the continuous workpiece which may be a metallic foil. The first layer may include a gallium-indium-selenide compound layer with a gallium to indium ratio of 0-0.8. On the first layer, a metallic layer including copper, gallium and indium metals is formed. In the metallic layer, gallium to indium ratio may be in the range of 0.2-0.3. After preparing the precursor stack another layer of selenium may be added on top of the stack and the multilayer structure is reacted to form the Group IBIIIAVIA solar cell absorber.

Figure 1:
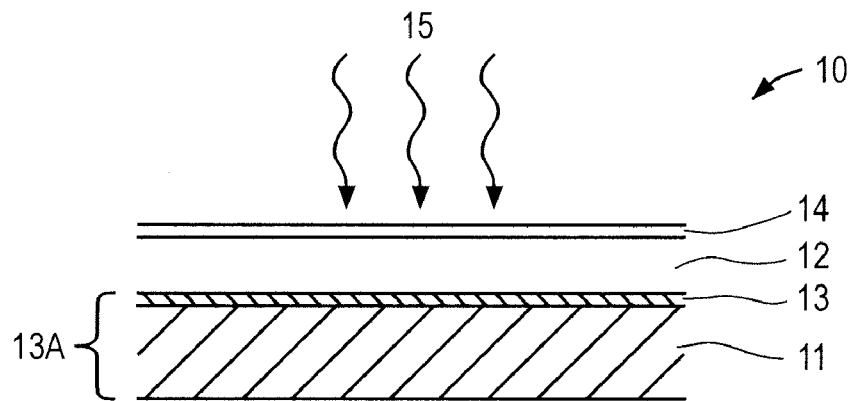
FIG. 1 is a cross-sectional view of a solar cell employing a Group IBIIIAVIA absorber layer.
Figure 2:
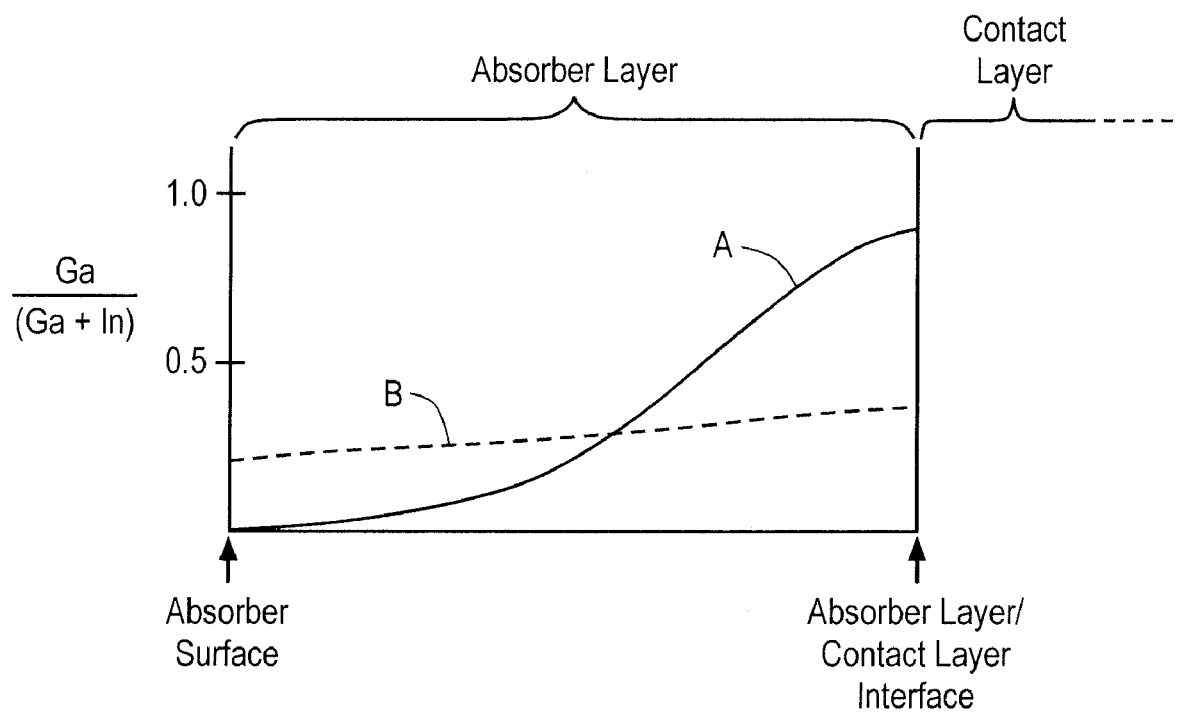
FIG. 2 shows Ga/(Ga+In) molar ratios in two different CIGS absorber layers, one with a Ga-poor surface (curve A) and the other with a more uniform Ga distribution (curve B).
Figure 3:
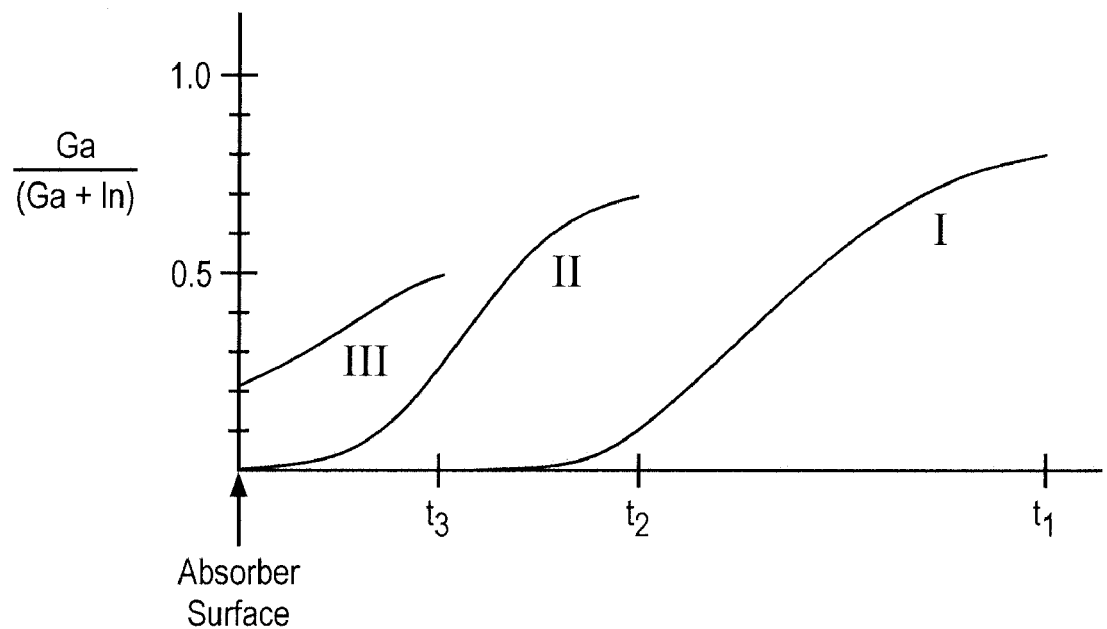
FIG. 3 schematically shows the effect of changing the absorber thickness on the distribution of Ga.

FIG. 3 schematically shows three different Ga distribution profiles through a CIGS absorber layer formed by selenization of a metallic precursor layer comprising Cu, In and Ga. The exemplary metallic precursor layer in this case may include but is not limited to stacks such as Cu/Ga/In, Cu/Ga/Cu/In, and Cu/Ga/Cu/In/Ga deposited on a base using methods such as sputtering, evaporation or electrodeposition. A layer of Se may then be deposited on top of the precursor stack forming a pre-absorber structure. The pre-absorber structure may then be converted into a $Cu(In,Ga)Se_2$ or CIGS absorber layer by increasing the temperature of the structure to a range of 400-600 C and facilitating reaction between, Cu, In, Ga and Se. As discussed earlier, such a process yields a Ga/(Ga+In) ratio distribution such as the one shown in Curve I in FIG. 3. It should be noted that in this example the thickness of the absorber is "$t_1$", and "$t_1$" may be in the range of 1-1.5 μm, which is a range that yields good quality solar cells in the laboratory.

As explained before, when a solar cell is fabricated on the surface of an absorber represented by Curve I of FIG. 3, the junction sees an absorber surface with Ga/(Ga+In) ratio of zero, i.e. it practically sees a $CuInSe_2$ or CIS surface. Therefore, the voltage of such a cell is low (typically in the range of 400-500 mV) and its efficiency is limited despite the fact that the overall Ga/(Ga+In) ratio integrated through the thickness "$t_1$" may be 20-30%, or even more.

One way of pushing Ga more towards the absorber surface during a two-stage process, while keeping the overall Ga/(Ga+In) ratio in the absorber the same, is reducing the thickness of the absorber layer formed, while keeping the Ga/(Ga+In) ratio the same. Curves II and III schematically show how the Ga distribution may change through the formed absorber layer as its thickness is reduced to "$t_2$" and "$t_3$", respectively. In this example, "$t_2$" may be in the range of 0.5-0.75 μm and "$t_3$" may be in the range of 0.2-0.4 μm. The problem with such an approach is the fact that as the thickness of the absorber gets reduced to and below 0.75 μm, light absorption gets reduced and mechanical defects such as pinholes introduce shunts in devices fabricated on such thin layers. As a result, even though Ga is pushed to the surface, the overall efficiency of the solar cells may actually go down.

Figure 4:
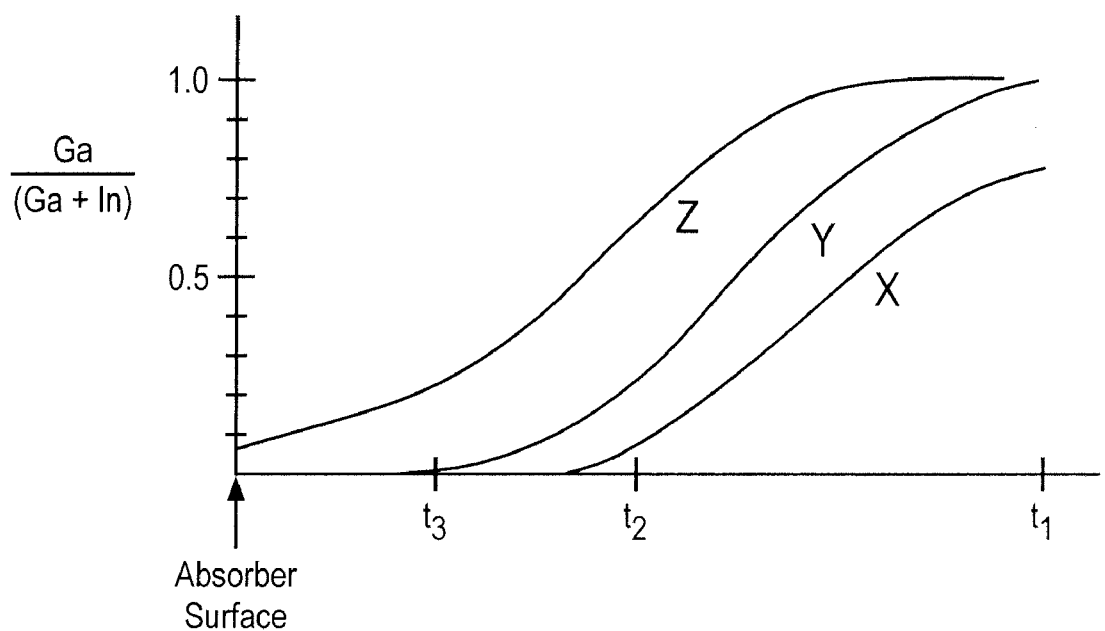
FIG. 4 schematically shows the effect of changing the total Ga content on the Ga distribution in the resulting CIGS absorber after reaction with Group VIA material.

Another method that may be used to increase the amount of Ga near the surface region of a CIGS layer prepared by a two-stage process is to increase the overall Ga content of the precursor film and the absorber layer beyond the optimum 20-30%. The Ga/(Ga+In) ratio plots in FIG. 4 show schematically how the Ga content near the absorber surface may be increased towards the optimum level of 20-30% as the total Ga content of the film is increased. In this case the thickness of the absorber is kept at a level (such as 1-1.5 μm) that yields films with good mechanical integrity and low pinhole density. The overall Ga/(Ga+In) ratio in the metallic precursor stack may be increased from 30% (Curve "X") to 50% (Curve "Y") and 70% (Curve "Z"). As can be seen, the Ga molar ratio near the absorber surface may be increased this way, eventually getting close to the ideal 20-30% range. The problem with this approach, however, may be the fact that although the near surface region may have the good solar cell material necessary for high efficiency, most of the absorber layer contains a Ga/(Ga+In) ratio that is much higher than that. In fact the absorber/contact layer interface contains essentially a CGS or $CuGaSe_2$ layer. As explained earlier, the electronic quality of CIGS layers with Ga molar ratio of higher than 30% is not good. Therefore, generated current collection from these regions may not be efficient. As a result, although the voltage of the cell may be high (higher than 600 mV) due to the presence of Ga near the surface region, the short circuit current density may go down due to presence of high Ga deeper in the absorber, thus lowering the overall solar cell efficiency. Using this approach, however, it is possible to fabricate solar cells with efficiency values over 10%.

To address the issues described above another embodiment of a two-stage method of the present invention may be used. In this method, a non-metallic film is used in a first layer of a precursor stack. Accordingly, a portion of the indium necessary for absorber formation is included in the precursor material in the form of a non-metallic material, such as indium-Group VIA or indium-gallium-Group VIA compound, for example, indium-selenide or indium-gallium-selenide. The non-metallic material film is placed near the contact layer interface away from the surface region to form the first layer of a precursor stack or structure. There can be one or more metal films such as a copper film, between the contact layer and the film comprising the non-metallic material. Over the first layer, a metallic stack or layer is built. Gallium, In and optionally Cu are included in the metallic layer in metallic form so that during the reaction step of the two-stage process fast diffusion and grain fusing may take place between the first layer and the metallic layer resulting a columnar grain structure in the formed CIGS compound layer.

Figure 6A:
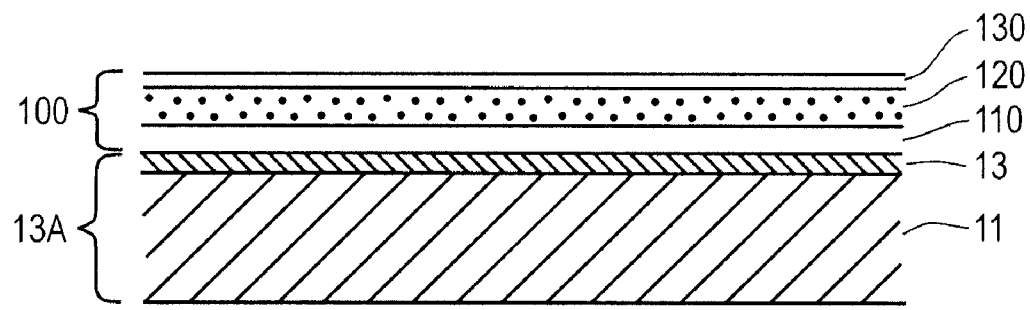
FIG. 6A is a structure according to an embodiment of the present invention.
Figure 6B:
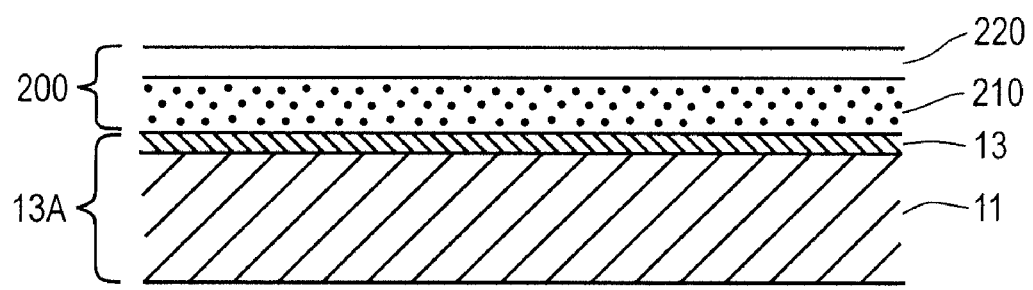
FIG. 6B is another structure according to an embodiment of the present invention.

It should be noted that in a columnar structure, grains extend from the surface of the compound film all the way to the contact layer. In this approach presence of metallic Ga near the surface region of the film allows good grain growth and at the same time Ga is encouraged to react with the Group VIA material and stay near the surface region. The precursor stack of the present invention may be configured in various structures. For example, a precursor stack of copper/indium-gallium-selenide/metal layer (Cu/(In,Ga)Se/metal layer), or (In,Ga)Se/metal layer may be deposited on a base, forming a base/Cu/(In,Ga)Se/metal layer, or base/(In,Ga)Se/metal layer structure In these precursor structures, the (In,Ga)Se layer is an indium-gallium selenide layer with Ga/(Ga+In) ratio ranging from 0 to about 0.8. The metal layer comprises Ga and In and optionally Cu. These precursor stacks are depicted in FIGS. 6A and 6B. In FIG. 6A the base 13A comprises a substrate 11 and a contact layer 13, and the precursor stack 100 is deposited on the exposed surface of the contact layer. In this embodiment, the precursor stack 100 comprises a first layer having a Cu film 110 and an (In,Ga)Se film 120, and a metal layer 130. The metal layer 130 may or may not comprise Cu.

The metal layer 130 within the precursor stack 100 may itself be a stack of metal films such as a Ga/In, In/Ga, Cu/Ga/In, Cu/In/Ga, Ga/In/Cu, In/Ga/Cu, Cu/Ga/In, Cu/In/Ga, Cu/Ga/In/Cu, and Cu/In/Ga/Cu stack and the like. It is also possible that the metals (In, Ga and optionally Cu) within the metal layer 130 be in the form of mixtures or alloys rather than discrete layers forming a stack. In FIG. 6B the base 13A comprises a substrate 11 and a contact layer 13, and the precursor stack 200 is deposited on the exposed surface of the contact layer. The precursor stack 200 comprises a first layer comprising an (In,Ga)Se film 210, and a metal layer 220. In this case the metal layer 220 has to contain all of Cu, In and Ga. The metal layer 220 within the precursor stack 200 may itself be a stack of metal films such as a Cu/Ga/In, Cu/In/Ga, Ga/In/Cu, In/Ga/Cu, Cu/Ga/In, Cu/In/Ga, Cu/Ga/In/Cu, and Cu/In/Ga/Cu stack and the like. It is also possible that the metals (In, Ga and Cu) within the metal layer 220 be in the form of mixtures or alloys rather than discrete layers forming a stack.

It should be noted that the precursor stacks of the present invention are different than the stacks utilized by Nakagawa et al. reference. In Nakagawa's work Ga in the precursor is chemically tied in a Ga-selenide layer. In the present stack it is important that the Ga is placed near the surface of the precursor stack and is in metallic state either by itself or alloyed with another metal. The metal film or metal layer of the present invention also comprises In, unlike that of Nakagawa reference. Presence of such metallic phases with low melting temperatures (Ga melting temperature around 30° C. and In melting temperature about 156° C.) in the precursor stack assures good fusing and grain growth during the reaction or selenization step. It is of course possible to add some amount of Group VIA material within the metal layer 130 of FIG. 6A and the metal layer 220 of FIG. 6B as long as the metallic character and low temperature melting character is kept. Therefore, the amount of Group VIA material (such as Se) added to within such metal layers should be <30% atomic, preferably <10% atomic of the total Cu, In, Ga and Group VIA material within the metal layer.

Once the above described base/Cu/(In,Ga)Se/metal film, or base/(In,Ga)Se/metal layer structures depicted in FIGS. 6A and 6B are formed (as stacks that have substantially distinct layers without any substantial reaction between them as depicted in FIGS. 6A and 6B), the stacks may be selenized (and thus causing a reaction between the distinct layers as also noted below) to convert them into absorber layers. Selenization may be carried out at temperatures in the range of 400-600° C. in Se-containing atmosphere for times ranging from 5 to 60 minutes. A Se layer may also be deposited on the exposed surface of the precursor stack of FIG. 6A or FIG. 6B before the reaction step, in which case rapid reaction of Cu, In, Ga and Se may be more readily achieved in a rapid thermal annealing process.

Figure 5:
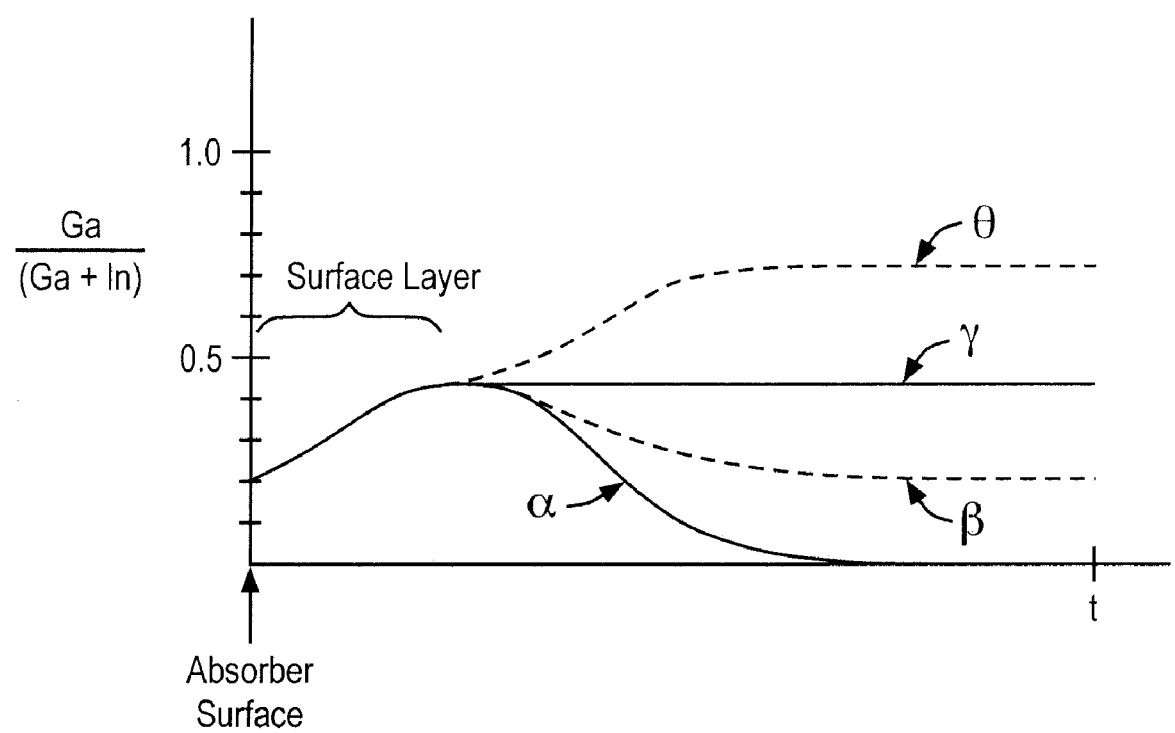
FIG. 5 schematically shows various Ga distribution profiles provided according to an embodiment of the present invention.

The benefit of the unique precursor stacks of the present invention may be understood in reference to FIG. 5. Curve "α" in FIG. 5 schematically shows the Ga distribution through an absorber layer formed by selenization of a Cu/(In) Se/metal film stack of FIG. 6A where the metal film may comprise Ga and In. Similar results may be obtained if the precursor stack is (In)Se/metal layer (see FIG. 6B), where, in this case, the metal layer may comprise Ga, In and Cu. In this example the Ga/(Ga+In) ratio within the metal film is selected to be about 0.3 since when selenized, the metal film will be converted into an absorber portion near the surface with the desired Ga/(Ga+In) ratio of about 0.2-0.3.

The thickness of the Cu deposited on the base or included in the metal film, on the other hand, is selected so that it is adequate to convert the (In)Se layer into a substantially CIS layer and the metal film into substantially a CIGS surface layer after the selenization step. Copper is very mobile and may be placed on the contact layer, under the (In)Se layer, or alternately it may be included in the metal layer without changing results. In any case, as can be seen from FIG. 5, Curve "α", a Ga-rich surface may be formed using this approach even with a total film thickness "t" of 1-1.5 μm. The reason for this is the fact that much of the In (such as 50-80%) necessary for the overall CIGS absorber layer is chemically tied in the form of indium selenide in the back of the precursor stack and cannot readily react with additional selenium introduced during the selenization step. Therefore, it cannot diffuse to the surface and replace Ga near the absorber surface during the reaction step. Rather, it stays in the back of the device. The Ga distribution in the back of the absorber may be controlled independently in the present approach by increasing or decreasing the Ga content of the (In,Ga)Se layer. Curve "α" is for the case with no Ga in the (In,Ga)Se layer, i.e. use of an (In)Se layer. As the amount of Ga is increased in the (In,Ga)Se layer, one can form Ga grading depicted by curves "β", "γ", and "θ". To obtain an absorber represented by Curve "γ" for example, the Ga/(Ga+In) ratio within the (In,Ga)Se layer may be around 0.4. This ratio may be around 0.7 for the absorber represented by Curve "θ".

The ability of being able to control the Ga content in the back of the absorber without affecting much the Ga content within the surface layer of the absorber is valuable since both may be optimized separately. The Ga profile of Curve "θ", for, example forms an electron reflector that can help light generated current collection. The Ga profile of Curve "γ" is similar to films grown by the co-evaporation method that yields very high efficiency solar cells. The fact that, Ga can be brought to the surface without reducing the thickness of the absorber layer to levels below 0.5 μm, or increasing the overall Ga/(Ga+In) ratio within the absorber to levels beyond 60-70% opens up the process window of the two-stage techniques for high efficiency solar cell manufacturing.

The layers within the precursor stack of the present invention may be deposited by one or more techniques selected from the group comprising, electroplating, evaporation, ink deposition and sputtering. Electroplating is especially attractive to practice this invention. Accordingly, an electroplating technique may be used to: i) electroplate an (In,Ga)Se compound layer on a contact layer (such as Mo, Ru, Ir etc.)

deposited on a substrate (such as glass, kapton, metallic foil etc.), and ii) electroplate a metal film over the (In,Ga)Se layer. In this case metal film may comprise Cu, In and Ga. For example, the metal film may be obtained by electroplating discrete layers of Cu, Ga and In, or by electroplating a metallic Cu—In—Ga alloy, or by electroplating a binary alloy layer (such as a Cu—Ga, In—Ga or Cu—In alloy) and a discrete layer of Cu or In or Ga.

Alternately, precursor stack preparation may include; i) electrodeposition of a Cu layer on the contact layer, ii) electrodeposition of an (In,Ga)Se compound layer over the Cu layer, and iii) electroplating a metal film over the (In,Ga)Se layer. In this case, the metal film may contain just In and Ga (such as an electroplated In—Ga alloy, an electroplated In/Ga or Ga/In or Ga/In/Ga etc. stack), or it may also contain additional Cu like the case described above.

Once the electroplated precursor film or stack is formed on the base, selenium may be deposited on the precursor by evaporation or electroplating. A dopant such as Na may also be added to the structure formed. The structure may be heated to a temperature in the range of 400-600° C. to form a CIGS layer. The Ga distribution in the CIGS layer may be any of the cases depicted in FIG. 5 depending on the Ga content of the (In,Ga)Se layer and the metal film.

Solar cells may be fabricated on the CIGS compound layers of the present invention using materials and methods well known in the field. For example a thin (<0.1 microns) CdS layer may be deposited on the surface of the compound layer using the chemical dip method. A transparent window of a transparent conductive oxide such as ZnO may be deposited over the CdS layer using MOCVD or sputtering techniques. A metallic finger pattern is optionally deposited over the ZnO to complete the solar cell.

Although the present invention is described with respect to certain preferred embodiments, modifications thereto will be apparent to those skilled in the art.

What is claimed is:

1. A process of forming a Group IBIIIAVIA absorber on a base, comprising:
   forming a first layer comprising an indium-gallium-selenide compound film on the base;
   forming a metallic layer on the first layer, the metallic layer comprising a Group IB metal, a Group IIIA metal and another Group IIIA metal without a Group VIA material, wherein the base is at a substantially ambient temperature when the metallic layer is formed, and wherein the first layer and the metallic layer are distinct layers with no substantial reaction therebetween during the forming of the metallic layer; and
   reacting the first layer, the metallic layer and a Group VIA material.

2. The process of claim 1, wherein the first layer further comprises a first metal film of a Group IB metal, wherein the indium-gallium-selenide compound material film is deposited over the first metal film at a substantially ambient temperature.

3. The process of claim 1, wherein forming the metallic layer comprises:
   depositing a copper film onto the first layer;
   depositing a gallium film onto the copper film; and
   depositing an indium film onto the gallium film.

4. The process of claim 3, wherein forming the metallic layer further comprises depositing another copper film onto the indium film.

5. The process of claim 1, wherein the gallium to indium molar ratio of the indium-gallium-selenide compound film is in the range of 0 to 0.8.

6. The process of claim 1, wherein a molar ratio of gallium to indium in the metallic layer is in the range of 0.2 to 0.3.

7. The process of claim 1, wherein the step of reacting comprises depositing a Group VIA material on the metallic layer, thereby forming a pre-absorber structure, and heating the pre-absorber structure 200-600° C.

8. The process of claim 2, wherein the step of forming the first layer comprises electrodepositing a copper film on the base and electrodepositing the (In,Ga)Se compound film on the copper film.

9. The process of claim 1, wherein the step of forming the first layer comprises electrodepositing the (In,Ga)Se compound film on the base.

10. The process of claim 9, wherein forming the metallic layer comprises:
    electrodepositing a copper film onto the (In, Ga) Se compound film;
    electrodepositing a gallium film onto the copper film; and
    electrodepositing an indium film onto the gallium film.

11. The process of claim 10, wherein forming the metallic layer further comprises electrodepositing another copper film onto the indium film.

12. The process of claim 8, wherein forming the metallic layer comprise electrodepositing a copper-indium-Gallium alloy film onto the (In, Ga) Se compound film.

* * * * *